(12) United States Patent
Sugiyama

(10) Patent No.: US 10,886,205 B2
(45) Date of Patent: Jan. 5, 2021

(54) TERMINAL STRUCTURE AND SEMICONDUCTOR MODULE

(71) Applicant: FUJI ELECTRIC CO., LTD., Kawasaki (JP)

(72) Inventor: Takanori Sugiyama, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/366,251

(22) Filed: Mar. 27, 2019

(65) Prior Publication Data

US 2019/0348349 A1 Nov. 14, 2019

(30) Foreign Application Priority Data

May 8, 2018 (JP) ................. 2018-090058

(51) Int. Cl.

| H01L 29/66 | (2006.01) |
|---|---|
| H01L 23/495 | (2006.01) |
| H01L 21/48 | (2006.01) |
| H01L 23/00 | (2006.01) |

(52) U.S. Cl.
CPC .... *H01L 23/49555* (2013.01); *H01L 21/4842* (2013.01); *H01L 24/48* (2013.01)

(58) Field of Classification Search
CPC combination set(s) only.
See application file for complete search history.

(56) References Cited

U.S. PATENT DOCUMENTS

| 2015/0136478 A1* | 5/2015 | Biesse ...................... H02G 3/32 |
|---|---|---|
| | | 174/72 A |
| 2017/0170150 A1* | 6/2017 | Iguchi ..................... H01L 25/18 |

FOREIGN PATENT DOCUMENTS

| JP | 2003-025019 A | 1/2003 |
|---|---|---|
| JP | 2007-234696 A | 9/2007 |

* cited by examiner

*Primary Examiner* — Robert G Bachner
(74) *Attorney, Agent, or Firm* — Rabin & Berdo, P.C.

(57) ABSTRACT

A terminal structure of a terminal used for connecting a semiconductor device included in a semiconductor module to an outside element, including plate-shaped portions at both ends, and a bent portion positioned between the plate-shaped portions. The bent portion has an outer surface at an outer side of the bent portion, and an inner surface at an inner side of the bent portion. The outer surface has a first uneven surface including a plurality of hollow portions and/or a plurality of protruding portions.

19 Claims, 11 Drawing Sheets

TERMINAL STRUCTURE AND SEMICONDUCTOR MODULE

CROSS REFERENCE TO RELATED APPLICATION

This application is based upon and claims the benefit of priority from the prior Japanese Patent Application No. 2018-090058, filed on May 8, 2018; the entire contents of which are incorporated herein by reference.

BACKGROUND OF THE INVENTION

Field of the Invention

This disclosure relates to a terminal structure and a semiconductor module.

Description of the Related Art

A semiconductor module has a semiconductor device such as an insulated gate bipolar transistor (IGBT), a power metal oxide semiconductor field effect transistor (MOSFET), or a free wheeling diode (FWD), and is employed in an inverter device or the like. In general, in a manufacturing process of the semiconductor module, a board mounted with the semiconductor device is housed in a terminal casing, and an electrode of the semiconductor device is electrically connected to a terminal for external connection of the terminal casing. As such a terminal casing of the semiconductor module, a terminal casing formed by bending a plate-shaped terminal for external connection is known in the art (for example, see Japanese Unexamined Patent Application Publication No. 2007-234696).

However, in the terminal casing of Japanese Unexamined Patent Application Publication No. 2007-234696, a tensile stress is strongly applied to a plate surface corresponding to an outer surface in a bent state of the plate-shaped terminal, so that a crack is generated in the outer plate surface of the terminal disadvantageously. For this reason, corrosion of the terminal easily progresses by the crack, and the cross-sectional area of the terminal is reduced so as to increase electrical resistance.

SUMMARY OF THE INVENTION

In view of the aforementioned problems, it is therefore an object of the invention to provide a terminal structure and a semiconductor module, capable of suitably bending the terminal without generating a crack.

According to an aspect of the disclosure, there is provided a terminal structure of a semiconductor module, formed by bending a plate-shaped terminal, the terminal structure comprising plate surfaces, one of the plate surfaces of the terminal having an unevenness including at least one of a plurality of hollow shapes or a plurality of protruding shapes formed in a predetermined region corresponding to an outer curved surface in a bent state.

According to this disclosure, the surface area of the predetermined region of the one plate surface increases due to the unevenness. Therefore, although a tensile stress is strongly applied to a predetermined region corresponding to an outer curved surface in a bent state of the terminal, elongation is allowed in the outer bending side by an increase of the surface area of the predetermined region. Since the increase of the surface area is used for elongation of the plate surface, it is possible to prevent a crack from being generated in the one plate surface and to suitably bend the terminal while suppressing progression of corrosion and an increase of the electric resistance in the terminal.

DESCRIPTION OF EMBODIMENTS

Figure 1:
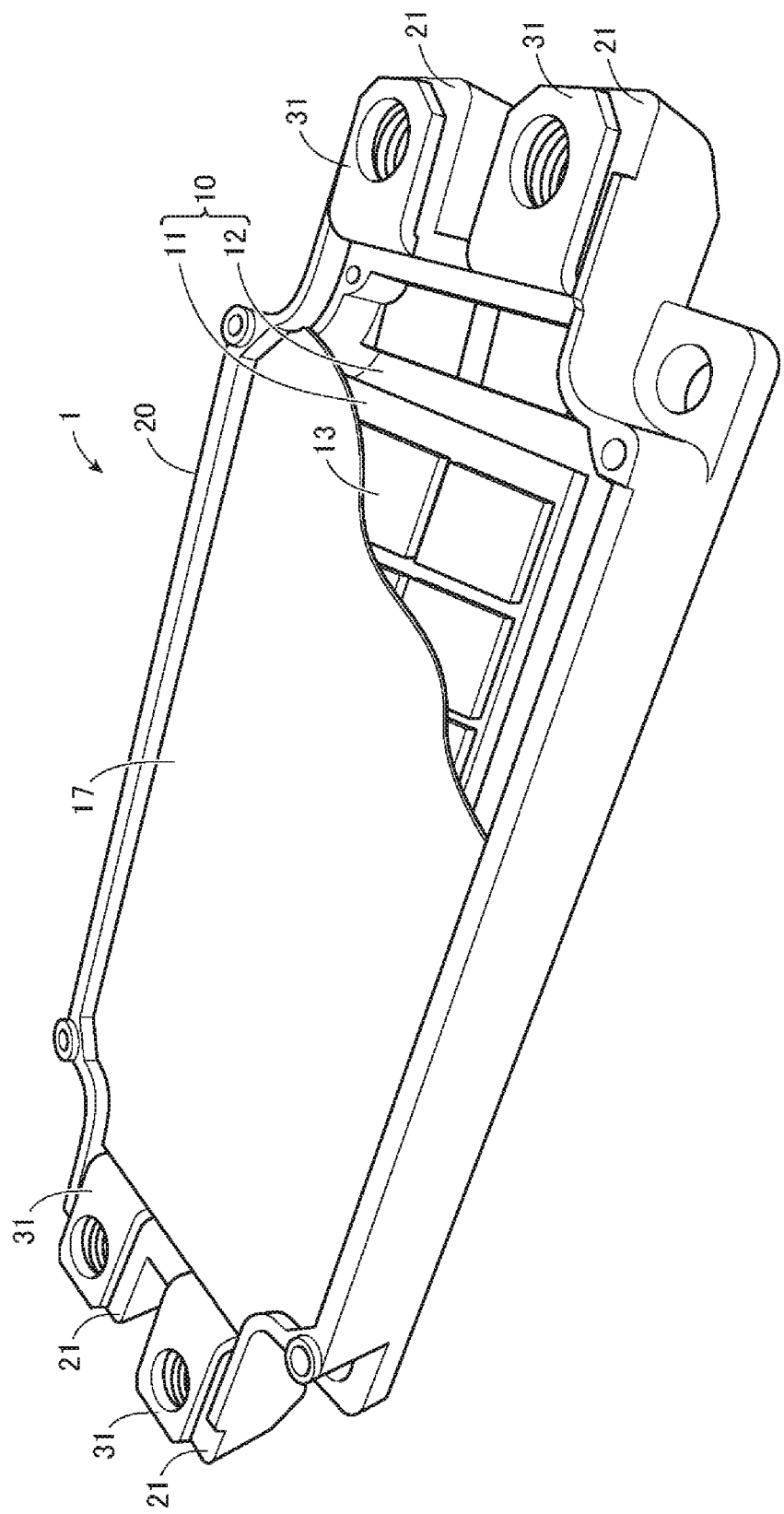
FIG. 1 is a perspective view illustrating a semiconductor module according to an embodiment of the invention.
Figure 2:
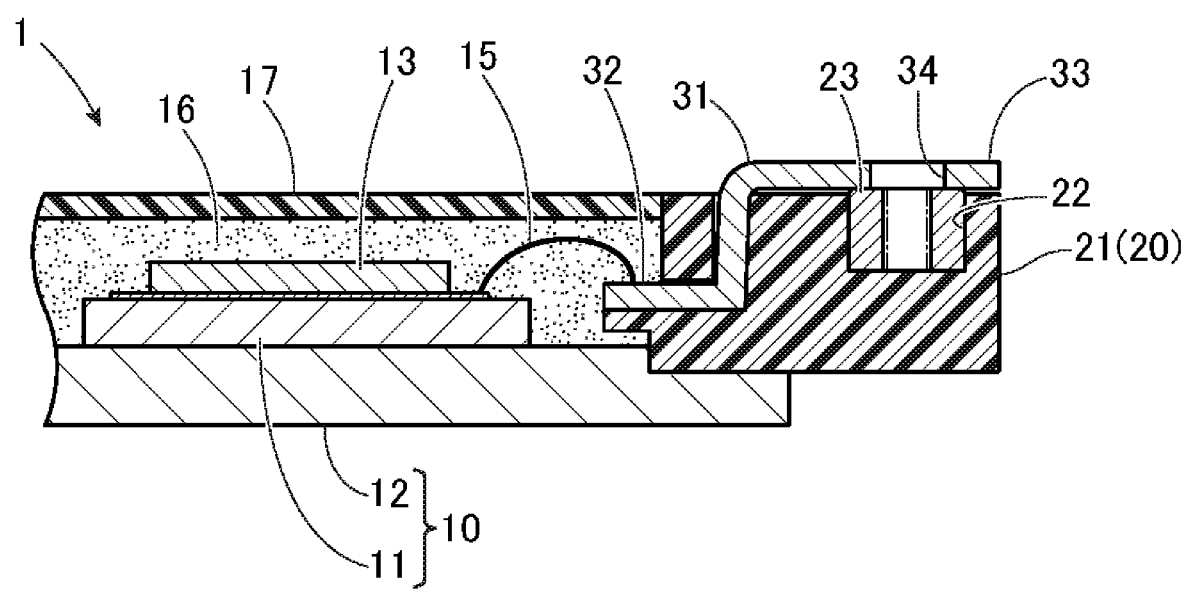
FIG. 2 is a partial cross-sectional view illustrating the semiconductor module according to an embodiment of the invention.

A semiconductor module according to an embodiment of the invention will now be described. FIG. 1 is a perspective view illustrating the semiconductor module according to this embodiment. FIG. 2 is a partial cross-sectional view illustrating the semiconductor module according to this embodiment. Note that a sealing resin and a bonding wire are not illustrated in FIG. 1 for simplicity purposes. In addition, while the technology of this disclosure will be described by exemplifying a semiconductor module provided with a terminal casing in the following description, this technology is also applicable to a full-mold structure semiconductor module having no terminal casing.

As illustrated in FIG. 1, the semiconductor module 1 is formed by packaging a plurality of semiconductor devices 13 and housing a laminated board 10 mounted with the semiconductor devices 13 in a terminal casing 20. A ceramic circuit board 11 having a conductor pattern is provided on a front side of the laminated board 10, and a plurality of semiconductor devices 13 are bonded onto the conductor pattern. A copper-based heat dissipation plate 12 is provided on a back side of the laminated board 10 (see FIG. 2), so that the heat from the semiconductor device 13 is transferred to the heat dissipation plate 12 via the ceramic circuit board 11. Note that, in addition to the semiconductor devices 13, various electronic parts and wiring materials are arranged on the ceramic circuit board 11.

The semiconductor device 13 is formed of silicon (Si), silicon carbide (SiC), or the like. The semiconductor device 13 includes a switching element such as an insulated gate bipolar transistor (IGBT) or a power metal oxide semiconductor field effect transistor (MOSFET), a diode such as a free wheeling diode (FWD), and the like. In addition, the semiconductor device 13 may also include a reverse conducting (RC)-IGBT obtained by integrating the IGBT and the FWD, a reverse blocking (RB)-IGBT having a sufficient withstanding voltage against a reverse bias, or the like.

The terminal casing 20 is formed in a rectangular frame shape with its bottom being opened in order to house the laminated board 10 while exposing the heat dissipation plate 12 downward from an opening portion. A pair of terminal blocks 21 are provided in both ends of a longitudinal direction of the terminal casing 20. Each terminal block 21 has a housing portion 22 (see FIG. 2) which houses a nut 23, and the nut 23 is exposed from an upper face of the terminal block 21. In the vicinity of the terminal block 21, a plate-shaped terminal 31 bent in a crank shape as seen in a side view is insert-molded. One end of the terminal 31 protrudes toward the semiconductor device 13 and is exposed to the inside of the terminal casing 20. The other end of the terminal 31 is exposed to the outside of the terminal casing 20 and is bent to cover the upper face of the nut 23.

The terminal 31 is an external connection terminal through which an input/output current between the semiconductor module 1 and an external device flows. As illustrated in FIG. 2, a bonding surface 32 is formed in one end side of the terminal 31 and is electrically connected to an electrode of the semiconductor device 13. For example, the bonding surface 32 is connected to an electrode of the ceramic circuit board 11 mounted with the semiconductor device 13 via a bonding wire 15. An external electrode surface 33 is provided in the other end side of the terminal 31, and an opening 34 is formed coaxially with a screw hole of the nut 23. As a result, an external conductor (not shown) such as a busbar can be connected to the external electrode surface 33 of the terminal 31 by fixing a screw. Each terminal 31 is formed by covering a base material 35 formed of copper or a copper alloy with a corrosion-resistant plating layer 36 (see FIG. 5C), so that the base material 35 does not come into contact with the external air by providing the plating layer 36, and progression of corrosion such as sulfidation or oxidation of the base material 35 is suppressed. The plating layer 36 is formed of nickel, a nickel alloy, or the like.

A sealing resin 16 such as a silicon gel is filled in the terminal casing 20, so that the semiconductor device 13 and the bonding wire 15 are protected from an external impact or the like. A cover 17 is installed on an upper surface of the terminal casing 20 with an adhesive, and an internal space of the terminal casing 20 is entirely covered by the cover 17. The semiconductor module 1 having the aforementioned configuration is employed in an inverter device, an uninterruptible power supply (UPS), a machine tool, an industrial robot, a power generation facility, and an electronic control device of an automobile, or the like in order to implement energy saving, high efficiency, and high performance.

Meanwhile, in a process of manufacturing the terminal casing 20 of the semiconductor module 1, the terminal 31 is insert-molded in the terminal casing 20 before bending the other end side of the terminal 31 corresponding to the external electrode surface 33. In addition, the nut 23 is housed in the housing potion 22 of the terminal block 21 of the molded terminal casing 20, and the other end side of the terminal 31 is bent toward the nut 23 side to cover the nut 23, so that the terminal casing 20 is manufactured. However, there is a possibility of cracking in the terminal 31 due to the bending of the terminal 31, and the bending of the terminal 31 may cause the bonding surface 32 of one end side of the terminal 31 to float from an installation surface of the terminal casing 20.

Figure 3A:
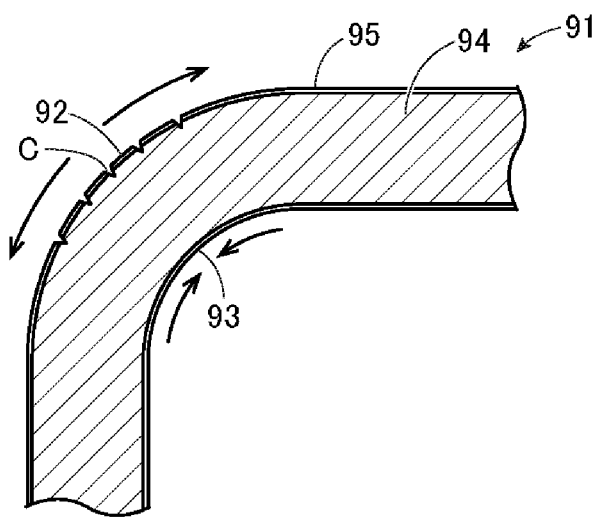
FIGS. 3A to 3C are explanatory diagrams illustrating a bent state of a terminal in a comparative example.
Figure 3B:
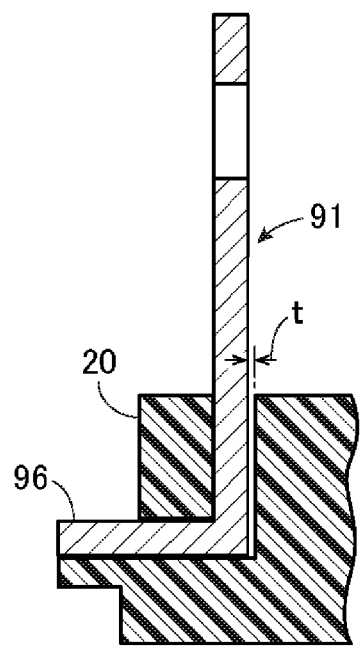
Figure 3C:
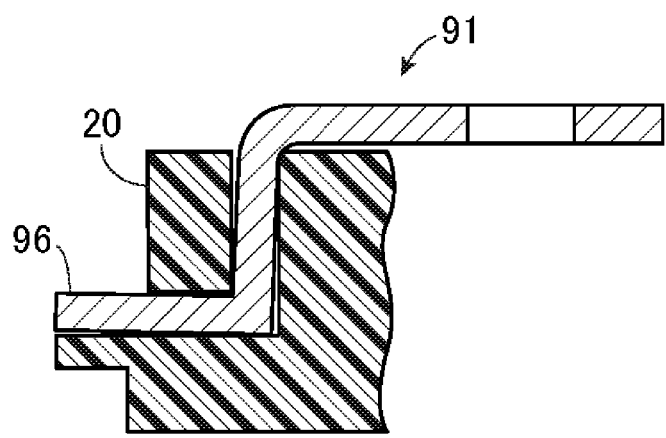

A comparative example of the terminal structure of the semiconductor module will now be described in details with reference to FIGS. 3A to 3C. FIGS. 3A to 3C are explanatory diagrams illustrating a bent state of the terminal in a comparative example. FIG. 3A is a partial cross-sectional view illustrating the terminal in a bent state. FIG. 3B is a partial cross-sectional view illustrating the semiconductor module before bending the terminal. FIG. 3C is a partial cross-sectional view illustrating the semiconductor module after bending the terminal.

More specifically, as illustrated in the comparative example of FIG. 3A, when the other end side of the terminal 91 is bent, a tensile stress is applied to one of the plate surfaces 92 which is the outer side in a bent state, and a compressive stress is applied to the other plate surface 93 which is the inner side in the bent state. While the one plate surface 92 is stretched due to the tensile stress, a crack C is initiated as it is stretched beyond a critical point of the one plate surface 92. In particular, since the base material 94 of the terminal 91 is covered by the plating layer 95, plating cracking and base material cracking are easily generated starting from the plating layer 95 which is vulnerable to a crack C. If the copper base material 94 is exposed to the outside, corrosion such as sulfidation or oxidation progresses in the terminal 91.

Although the terminal 91 is insert-molded in the terminal casing 20 as illustrated in the comparative example of FIG. 3B, it is difficult to cause the terminal 91 to tightly abut on the casing formed of resin without a gap. For example, a small gap t is formed between the terminal 91 and a vertical portion of the terminal casing 20. For this reason, if the other end side of the terminal 91 is bent oppositely to the bonding surface 96 as illustrated in FIG. 3C, a tensile stress is generated in the outer side of the bent portion, and a surface of the one end side of the terminal 91 facing the boding surface 96 is lifted from the terminal casing 20. In addition, floating occurs between the one end side of the terminal 91 and the terminal casing 20. For this reason, an ultrasonic vibration or a load is not appropriately transmitted to the bonding wire during bonding, so that a bonding property between the bonding wire and the bonding surface 96 is degraded.

Figure 4A:
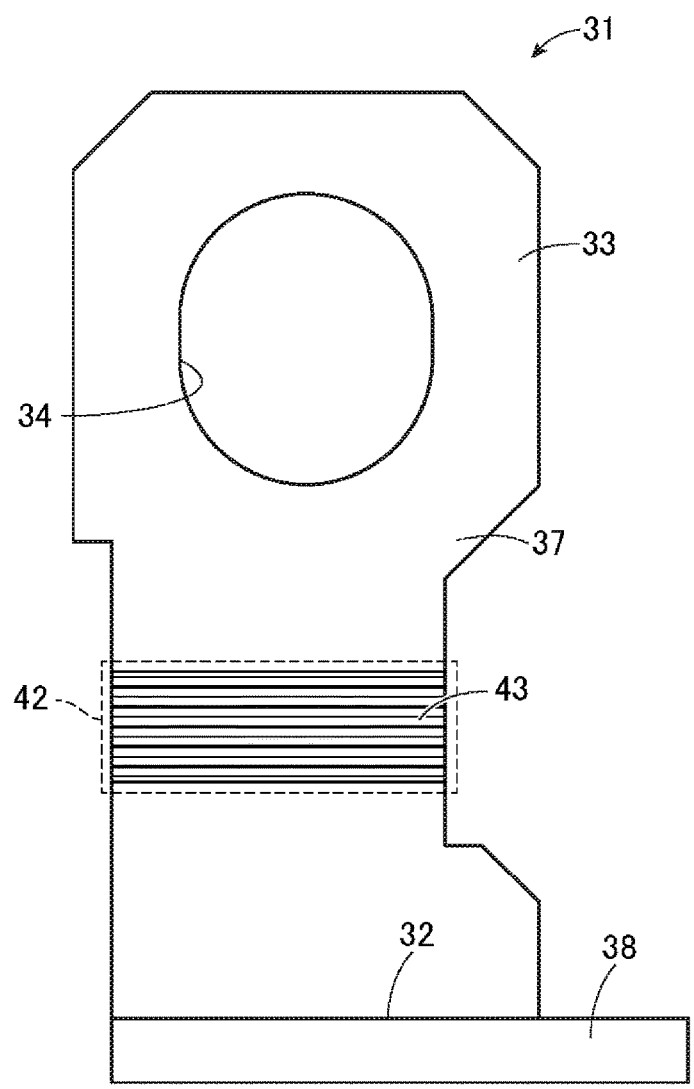
FIGS. 4A to 4C are trihedral views illustrating a terminal according to an embodiment of the invention.
Figure 4B:
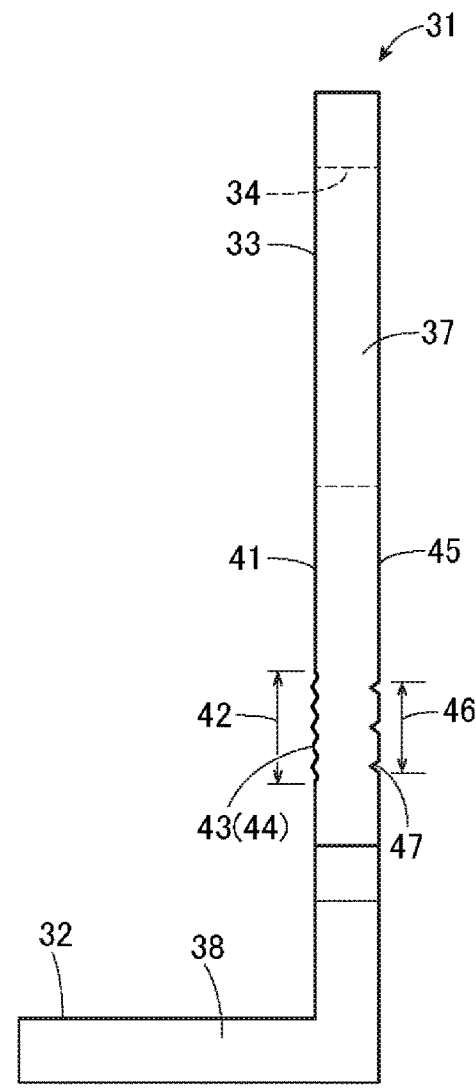
Figure 4C:
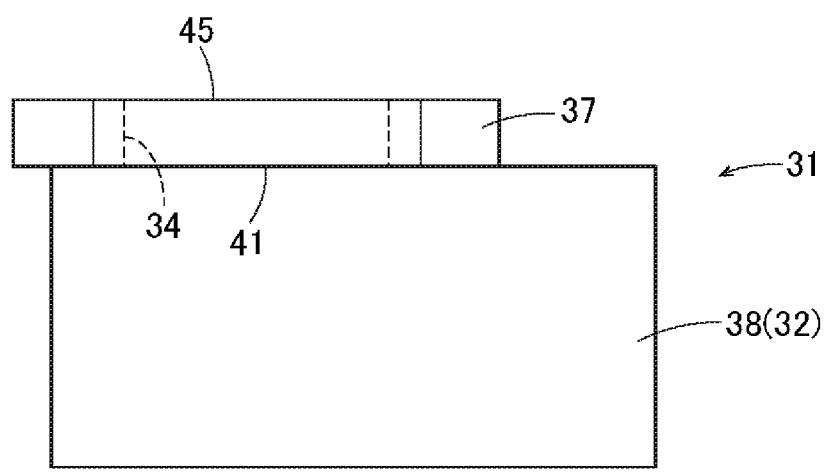

In this regard, according to this embodiment, an unevenness 43 is formed in a predetermined region corresponding to an outer curved surface in a bent state of the terminal 31 in order to increase a surface area (see FIGS. 4A to 4C). As a result, even when a strong tensile stress is applied to the outer side of the bending, the tensile stress is alleviated because the unevenness 43 is stretched. That is, since an increase of the surface area is used for elongation of the plate surface 41, a crack is not easily generated in the one plate surface 41. In addition, even when the other end side of the terminal 31 is pressed and bent toward a side opposite to the bonding surface 32, the one end side of the terminal 31 is not easily lifted because the tensile stress on the outer side of the bending is alleviated. Therefore, it is possible to suppress floating of the bonding surface 32 and prevent degradation of the bonding property between the bonding surface 32 and the bonding wire.

Figure 5A:
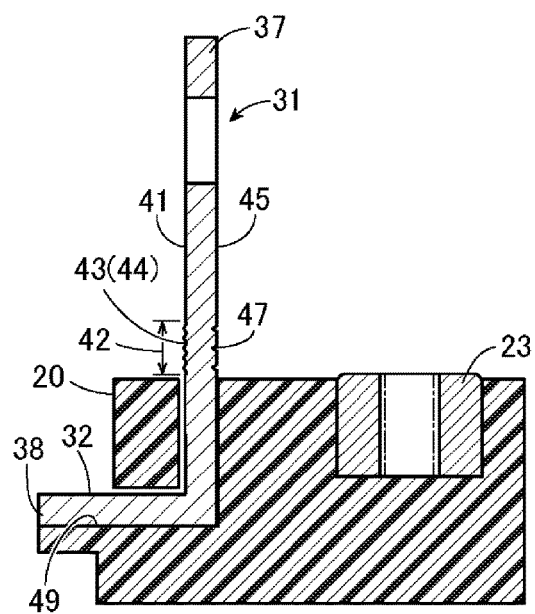
FIGS. 5A to 5E are explanatory diagrams illustrating a bent state of the terminal according to an embodiment of the invention.
Figure 5B:
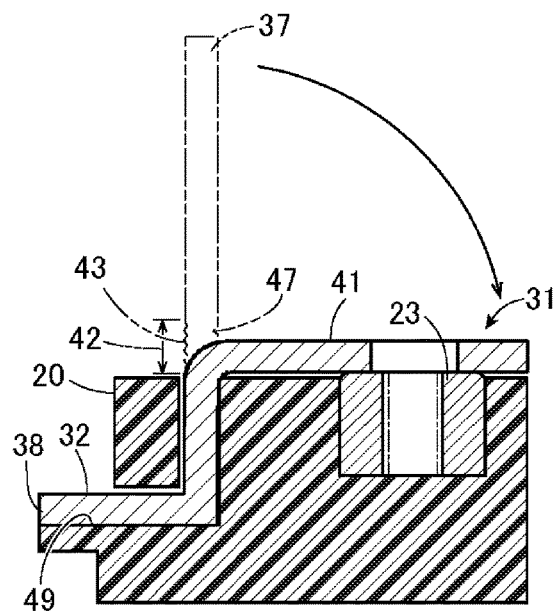

The terminal structure of the semiconductor module according to this embodiment will now be described in details with reference to FIGS. 4A to 4C and 5A to 5E. FIGS. 4A to 4C are trihedral views illustrating the terminal according to this embodiment. FIG. 4A is a front view illustrating the terminal as seen from the one plate surface side. FIG. 4B is a side view illustrating the terminal as the one plate surface is seen from the vertical direction. FIG. 4C is a top plan view illustrating the one plate surface as seen from the vertical direction. FIGS. 5A to 5E are explanatory diagrams illustrating a bent state of the terminal according to this embodiment. FIG. 5A is a partial cross-sectional view illustrating the semiconductor module before bending the terminal. FIG. 5B is a partial cross-sectional view illustrating the semiconductor module when the terminal is bent.

Figure 5C:
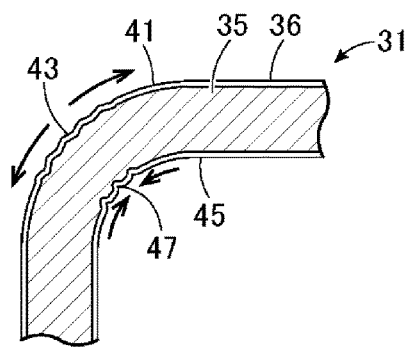
Figure 5D:
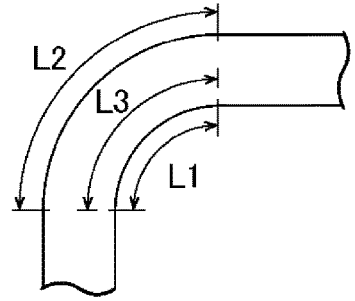
Figure 5E:
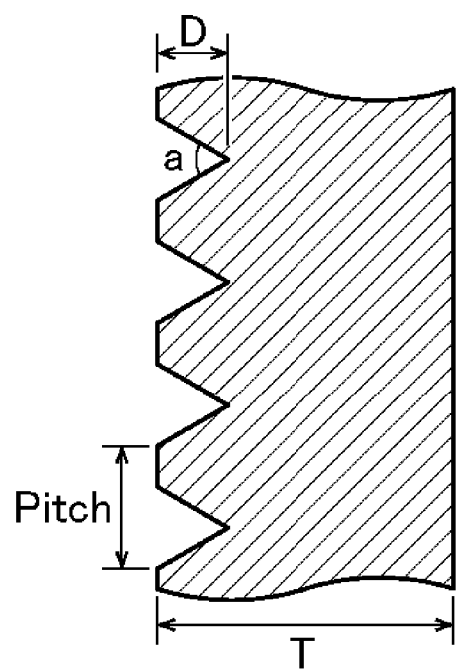

FIG. 5C is a partial cross-sectional view illustrating the terminal when the terminal is bent. FIG. 5D is a diagram illustrating lengths of each part of the terminal when the terminal is bent. FIG. 5E is a diagram illustrating a depth, an angle, and a pitch of the unevenness of the terminal. Note that, although an example in which the unevenness is formed as a V-groove is described here, the unevenness is not limited to the V-groove.

As illustrated in FIGS. 4A to 4C, the unbent terminal 31 is formed in an L-shape as seen in a side view, whose one end side extends horizontally, and the other end side extends right upward. A vertical plate portion 37 of the terminal 31 has a tip side having a wide width, and the tip side having a wide width has an opening 34 for fixing a screw. The vertical plate portion 37 has a narrow width between the tip side and a basal end side, and this portion having a narrow width is set as a predetermined bending position of the terminal 31. A surface of the horizontal plate portion 38 of the terminal 31 is set as a bonding surface 32 where the bonding wire 15 (see FIG. 2) is bonded, and a surface of the tip side of the vertical plate portion 37 is set as an external electrode surface 33 connected to an external conductor after the bending.

The one plate surface 41 of the terminal 31 has the unevenness 43 formed in a predetermined region 42 corresponding to an outer curved surface in a bent state. The other plate surface 45 has several V-grooves 47 in a predetermined region 46 corresponding to an inner curved surface in the bent state. According to this embodiment, the unevenness 43 having six V-grooves and five protrusions is formed on the one plate surface 41, and three V-grooves 47 are formed on the other plate surface 45. The unevenness 43 has a wide surface area in the predetermined region 42, so that an increase of the surface area is used as an elongation margin when the terminal 31 is bent. The unevenness 43 is formed by minute V-grooves 44 extending in the terminal width direction to match an actual terminal cracking shape. For this reason, it is possible to smoothly stretch the one plate surface 41 without generating terminal cracking in the bending of the terminal 31.

A groove bottom of the V-groove 44 of the unevenness 43 is slightly rounded. As a result, when the terminal 31 is bent, stress concentration at the groove bottom of the V-groove 44 is suppressed, so that a crack is not easily generated starting from the groove bottom of the V-groove 44 to the terminal 31. The V-groove 47 of the other plate surface 45 of the terminal 31 extends in the terminal width direction and serves as a starting point of the bending, so as to improve the bending accuracy of the terminal 31 and make it easier to bend. Since the unevenness 43 and the V-groove 47 are formed in a positional relationship where the one plate surface 41 and the other plate surface 45 oppose on the front and back of the terminal, it is possible to deform the unevenness 43 to match the bending of the terminal 31 starting from the V-groove 47.

In this manner, it is possible to suppress a crack of the terminal 31 by increasing the surface area using the unevenness 43 of the one plate surface 41 and improve bending accuracy of the terminal 31 by forming a bending starting point using the V-groove 47 of the other plate surface 45. That is, the V-grooves 44 are formed all over the predetermined region 42 on the plate surface 41 of the outer bending side in order to increase the surface area, and the V-grooves 47 are formed partially in the predetermined region 46 on the plate surface 45 of the inner bending side in order to improve bending accuracy of the terminal 31. Therefore, the predetermined region 42 of the unevenness 43 is a portion stretched when the terminal 31 is bent starting from the V-groove 47 formed in the predetermined region 46 opposing the predetermined region 42.

Since the unevenness 43 of the predetermined region 42 of the one plate surface 41 includes a plurality of V-grooves 44, it is possible to sufficiently secure the surface area even by forming individual V-grooves 44 with a shallow depth. In addition, since the V-grooves 44 are spread, it is possible to suppress stress concentration. Similarly, since the predetermined region 46 of the other plate surface 45 includes a plurality of V-grooves 47, it is possible to improve bendability of the terminal 31 even by forming each V-groove 47 with a shallow depth. Furthermore, since the V-grooves 47 are spread, it is possible to suppress stress concentration. For this reason, it is possible to obtain a sufficient plate thickness of the terminal 31 even in a portion where the unevenness 43 and the V-groove 47 are formed. Therefore, it is possible to suppress an increase of electric resistance caused by reduction of the plate thickness. Furthermore, it is possible to suppress stress concentration in the terminal 31 and prevent fracture of the terminal 31 caused by partial bending deformation.

Note that the depth of the V-groove 44 of the one plate surface 41, the depth of the V-groove 47 of the other plate surface 45, and the plate thickness of the terminal 31 are designed in consideration of terminal cracking, electric resistance, bendability, and the like. For example, in the terminal 31 having a thickness of 0.80 mm, preferably, the depth of the V-groove 44 of the one plate surface 41 is designed as "0.1 mm" or smaller, and the depth of the V-groove 47 of the other plate surface 45 is designed as "0.2 mm" or smaller. The thickness of the terminal 31 is preferably designed such that at least a thickness of 0.65 mm or larger remains when the terminal 31 is bent. Preferably, the depth of the V-groove 44 of the one plate surface 41 is set to 0.125 times or smaller than the original plate thickness, and the depth of the V-groove 47 of the other plate surface 45 is set to 0.25 times or smaller than the original plate thickness. In addition, the remaining thickness is preferably set to 0.8 times or larger than the original plate thickness. A fabrication method of the unevenness 43 and the V-groove 47 in the terminal 31 is not particularly limited. For example, the unevenness 43 and the V-groove 47 are formed by compressively deforming the terminal 31 through press fabrication.

The terminal 31 has a plating layer 36 on an outer surface of the base material 35 (see FIG. 5C). However, preferably, the base material 35 is plated after forming the unevenness 43 and the V-grooves 47 in the base material 35 through press fabrication. In a case where the base material 35 is plated before the press fabrication, and the plate layer 36 is excessively thin, plating cracking is easily generated by the pressing machining. If the plating layer 36 is excessively thick, plating cracking is easily generated when the terminal 31 is bent. However, in a case where plating can be performed with a suitable thickness so as not to generate plating cracking during the press fabrication or in a bent state of the terminal 31, the plating may be performed for the base material 35 before formation of the unevenness 43 and the V-groove 47 through press fabrication.

As illustrated in FIG. 5A, the terminal 31 before the bending is insert-molded into the terminal casing 20 in an L-shape as seen in a side view. The bonding surface 32 of the horizontal plate portion 38 of the terminal 31 is exposed to the inside of the terminal casing 20, and the vertical plate portion 37 of the terminal 31 is exposed to the upside from the terminal casing 20 except for the basal end side. The plate surface 41 of the vertical plate portion 37 facing the inside of the casing has an unevenness 43 having minute V-grooves 44 extending in the terminal width direction across a predetermined range from a location exposed from the terminal casing 20. The plate surface 45 of the vertical plate portion 37 facing the outside of the casing has several V-grooves 47 extending in the terminal width direction across a predetermined range from a location exposed from the terminal casing 20.

As illustrated in FIG. 5B, the tip side of the vertical plate portion 37 is bent oppositely to the bonding surface 32 and is pushed until the tip side of the vertical plate portion 37 is placed in parallel with the horizontal plate portion 38, so that the terminal 31 is formed in a crank shape as seen in a side view. In this case, a tensile stress is applied to the predetermined region 42 of the plate surface 41 which is the outer bending side, so that the unevenness 43 of the predetermined region 42 is deformed to be stretched. Since elongation in the predetermined region 42 is allowed as large as the surface area increased by the unevenness 43, a crack is not easily generated in the predetermined region 42 even when a tensile stress is applied by bending the terminal 31. In this manner, it is possible to improve an elongation limitation where a crack starts when a tensile stress is applied by the unevenness 43.

As illustrated in FIG. 5C, although the terminal 31 is covered with the plating layer 36 having higher rigidity than that of the base material 35, the surface area of the plating layer 36 also increases. Therefore, a crack is not easily generated in the plating layer 36 as well. Accordingly, it is possible to suppress plating cracking and base material cracking of the terminal 31 and improve an anti-corrosion property of the terminal 31. In addition, since the tensile stress is alleviated in the outer bending side when the terminal 31 is bent, the horizontal plate portion 38 of the terminal 31 is not easily lifted from the installation surface 49 of the terminal casing 20 (see FIG. 5B). Therefore, it is possible to suitably bond the bonding wire 15 to the bonding surface 32 (see FIG. 2) without widening a gap between the installation surface 49 of the terminal casing 20 and the horizontal plate portion 38 of the terminal 31.

Although a compressive stress is applied to the predetermined region 46 of the plate surface 45 corresponding to an inner bending side, the compressive stress is alleviated in the inner bending side by the V-groove 47. Therefore, the terminal 31 is easily bent starting from the inner V-groove 47. Since a plurality of V-grooves 47 are formed in the plate surface 45 corresponding to an inner bending side, it is possible to smoothen the bending angle of the terminal 31 and reduce a change of the cross-sectional area. Therefore, it is possible to suppress an increase of electric resistance. Since the V-groove 44 of the unevenness 43 of the outer bending side and the V-groove 47 of the inner bending side are formed with a shallow depth, it is possible to suppress an increase of electric resistance caused by a change of the cross-sectional area in the V-grooves 44 and 47.

Since an increase of the surface area caused by the unevenness 43 is used for elongation, the surface area of the unevenness 43 is larger than the surface area of a case where the unevenness 43 is not formed, by at least the area used for elongation generated by bending the terminal 31. For example, as illustrated in FIG. 5D, the necessary surface area of the unevenness 43 can be simply obtained from the outer length L2 with respect to the inner bending length L 1. Here, the semiconductor module 1 is formed by bending the terminal 31 having a plate thickness of 1.5 mm at an angle of 90° with an outer bending radius of 2.5 mm, by bending the terminal 31 having a plate thickness of 0.8 mm at an angle of 90° with an outer bending radius of 1.2 mm, or by bending the terminal 31 having a plate thickness of 2.0 mm at an angle of 90° with an outer bending radius of 6.0 mm. The ratio L2/L1 is set to 1.60, 1.67, or 1.50 times. For this reason, the surface area of the unevenness 43 is preferably set to 1.5 times or larger than that of a case where the unevenness 43 is not formed.

The unevenness 43 is provided in order to increase the surface area. Meanwhile, since an excessively large unevenness increases electric resistance or serves as a crack start point, the unevenness 43 is formed with a suitable size. For example, as illustrated in FIG. 5E, for the unevenness having the V-grooves formed in the terminal having a plate thickness "T" of 0.8 mm, a depth "D" is set to 0.1 mm, a tip angle "a" is set to 60°, and a pitch is set to 0.12 mm. For the unevenness having the V-grooves formed in the terminal having a plate thickness "T" of 1.5 mm, a depth "D" is set to 0.15 mm, a tip angle "a" is set to 50°, and a pitch is set to 0.25 mm. For the unevenness having the V-grooves formed in the terminal having a plate thickness "T" of 2.0 mm, a depth "D" is set to 0.18 mm, a tip angle "a" is set to 80°, and a pitch is set to 0.32 mm. The surface areas of these unevennesses are set to 1.96 times, 1.76 times, and 1.52 times that of the surface having no unevenness. For this reason, the surface area of the unevenness 43 is preferably set to 2.0 times or smaller than that of a case where the unevenness 43 is not formed.

Note that, as illustrated in FIG. 5D, the surface area of the unevenness 43 obtained using the aforementioned simple calculation method is formed slightly larger since a neutral plane where no stress is generated within the plate thickness is not used as reference. However, the slightly larger surface area does not influence on terminal cracking, electric resistance, or bendability. In addition, assuming that the length of the neutral plane is denoted by "L3", the surface area of the unevenness 43 may be set to L2/L3 times the surface area of a case where the unevenness 43 is not formed. The surface area of the unevenness 43 is preferably set to a size capable of absorbing elongation generated in the outer bending side, but is not limited to a size capable of perfectly absorbing elongation generated in the outer bending side. The surface area of the unevenness 43 may have at least a size suitable for reducing terminal cracking by absorbing elongation caused by bending of the terminal.

As described above, according to this embodiment, the surface area of the predetermined region 42 of the one plate surface 41 increases due to the unevenness 43. Therefore, although a tensile stress is strongly applied to the predetermined region 42 corresponding to the outer curved surface when the terminal 31 is bent, elongation is allowed in the outer bending side as large as an increase of the surface area of the predetermined region 42. Since the increase of the surface area is used for elongation of the plate surface 41, it is possible to suitably bend the terminal 31 while preventing a crack from being generated in the one plate surface 41 and suppressing progression of corrosion and an increase of electric resistance in the terminal.

Figure 6A:
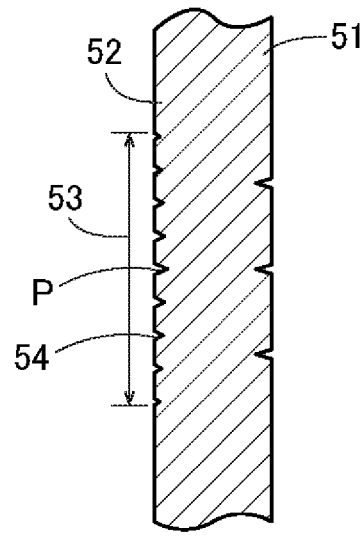
FIGS. 6A to 6F are diagrams illustrating exemplary unevennesses of the terminal according to a modification.
Figure 6B:
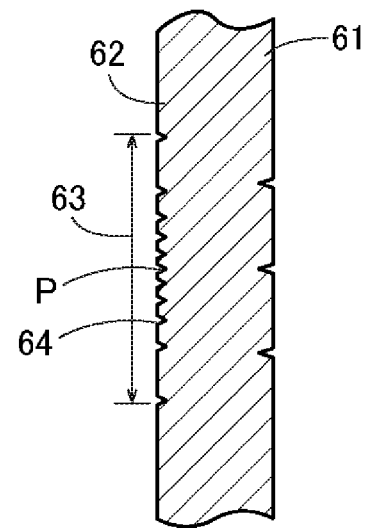
Figure 6C:
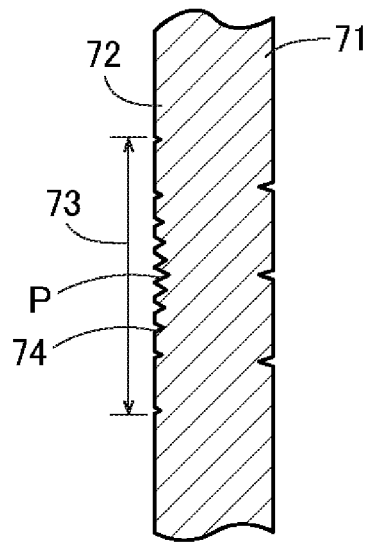
Figure 6D:
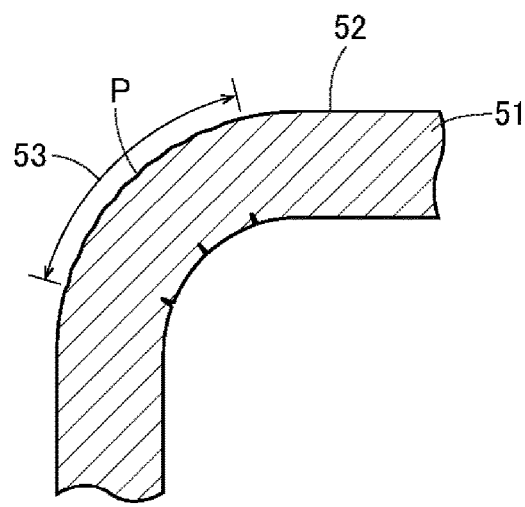
Figure 6E:
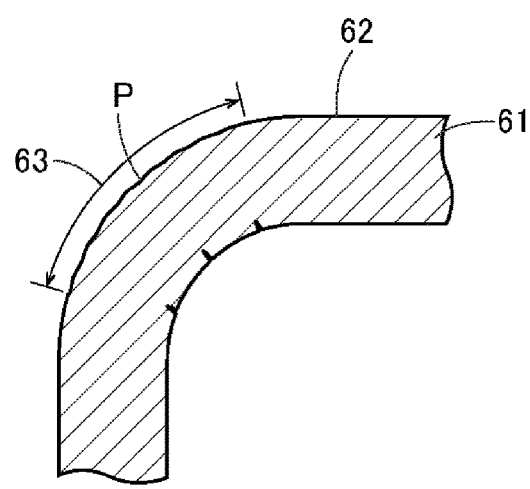
Figure 6F:
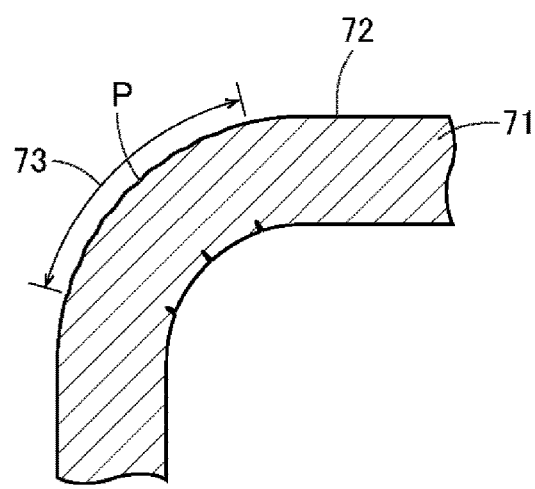
Figure 7A:
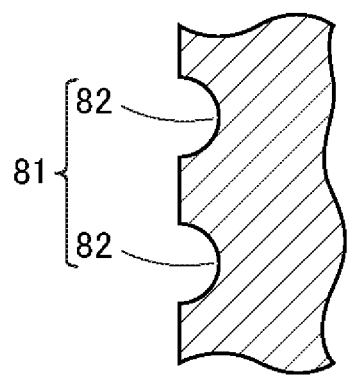
FIGS. 7A to 7C are diagrams illustrating exemplary unevennesses of the terminal according to another modification.
Figure 7B:
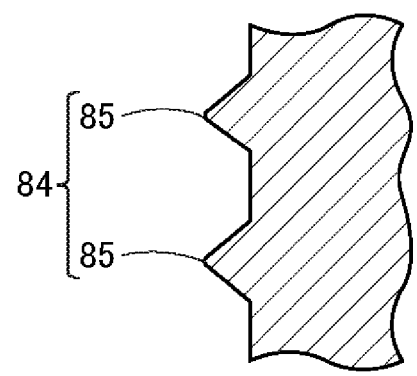
Figure 7C:
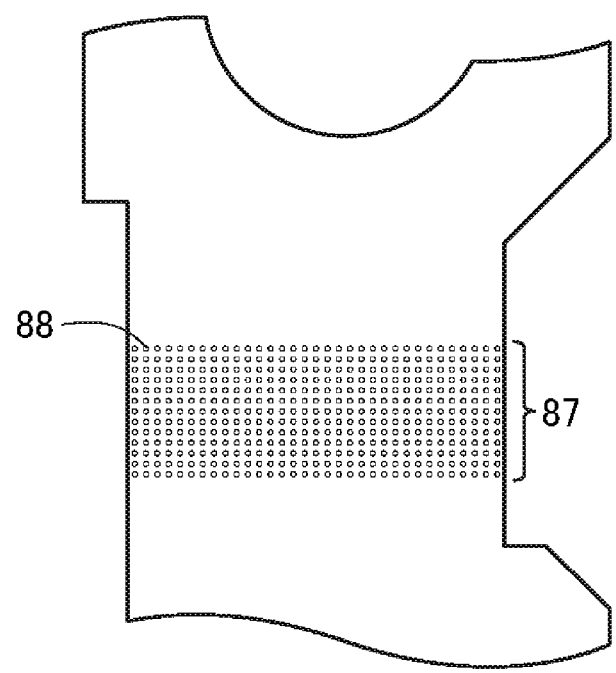

A modification of the terminal structure for the semiconductor module according to this embodiment will now be described in details with reference to FIGS. 6A to 6F and 7A to 7C. FIGS. 6A to 6F are diagrams illustrating exemplary unevennesses of the terminal according to a modification. FIGS. 6A to 6C are partial cross-sectional views illustrating the unbent terminal. FIGS. 6D to 6F are partial cross-sectional views when the terminals of FIGS. 6A to 6C are bent. FIGS. 7A to 7C are diagrams illustrating an exemplary unevenness of the terminal according to another modification. FIGS. 7A and 7B are partial enlarged cross-sectional views illustrating the unevenness of the terminal, and FIG. 7C is a front view illustrating the terminal as seen from one plate surface side.

Note that, as illustrated in the modification of FIGS. 6A and 6D, one of plate surfaces 52 of the terminal 51 may have an unevenness 54 formed in a predetermined region 53 corresponding to an outer curved surface in a bent state such that a height difference is reduced as a distance from a center point of bending surface P increases. As a result, it is possible to increase the height difference of the unevenness 54 in a portion where cracking is easily generated, such as the vicinity of the center point of bending surface P, and reduce the height difference of the unevenness 54 in a portion far from the center point of bending surface P, where cracking is not easily generated. Therefore, it is possible to form the unevenness 54 having a surface area depending on vulnerability to cracking of the terminal 51.

As illustrated in the modification of FIGS. 6B and 6E, one of plate surfaces 62 of the terminal 61 may have an unevenness 64 formed in a predetermined region 63 corresponding to an outer curved surface in a bent state such that a pitch increases as a distance from the center point of bending surface P increases. As a result, it is possible to reduce the pitch of the unevenness 64 in a portion where cracking is easily generated, such as the vicinity of the center point of bending surface P, and increase the pitch of the unevenness 64 in a portion far from the center point of bending surface P, where cracking is not easily generated. Therefore, it is possible to form the unevenness 64 having a surface area depending on vulnerability to cracking of the terminal 61.

As illustrated in the modification of FIGS. 6C and 6F, one of plate surfaces 72 of the terminal 71 may have an unevenness 74 formed in a predetermined region 73 corresponding to an outer curved surface in a bent state such that a height difference decreases, and a pitch increases as a distance from a center point of bending surface P increases. As a result, it is possible to increase the height difference of the unevenness 74 and decrease the pitch in a portion where cracking is easily generated, such as the vicinity of the center point of bending surface P, and reduce the height difference of the unevenness 74 and increase the pitch in a portion far from the center point of bending surface P, where cracking is not easily generated. Therefore, it is possible to form the unevenness 74 having a surface area depending on vulnerability to cracking of the terminal 71.

The unevenness may be shaped to increase the surface area in a portion corresponding to an outer side when the terminal is bent, and the unevenness may be formed to have a plurality of hollow shapes extending in the terminal width direction. For example, as illustrated in the modification of FIG. 7A, the unevenness 81 may have a plurality of U-grooves 82 extending in the terminal width direction. In this configuration, it is possible to suppress stress concentration in the groove bottom of the U-groove 82 and prevent a crack from being easily generated in a portion corresponding to the outer side in a bent state.

The unevenness may be formed in a protruding shape. For example, as illustrated in the modification of FIG. 7B, the unevenness 84 may include a plurality of protruding shapes 85. In this configuration, compared to a case where a hollow shape is formed, it is possible to sufficiently secure the plate thickness. Therefore, the electric resistance does not increase even by bending the terminal.

As illustrated in the modification of FIG. 7C, the unevenness 87 may include a plurality of depressions 88 spread in a dot shape. In addition, although not shown in the drawings, the unevenness may include a plurality of protrusions spread in a dot shape. Even in these configurations, it is possible to increase the surface area in a portion corresponding to the outer side in a bent state.

In this embodiment, the V-grooves are formed in the predetermined region on the plate surface corresponding to the inner side in a bent state of the terminal. However, any hollow may be formed as long as it serves as a bending start point. For example, the hollow may include a U-groove.

In this embodiment, the unevenness is formed in the predetermined region corresponding to the outer curved surface in a bent state of the terminal, and the V-groove is formed in the predetermined region corresponding to the inner curved surface in a bent state of the terminal. However, the invention is not limited as long as at least the unevenness is formed in the predetermined region corresponding to the outer curved surface in a bent state of the terminal.

In this embodiment, the technology of this disclosure is applied to the terminal having the bonding surface. However, the invention is not limited to this configuration. The technology of this disclosure may be applied to any type of terminal as long as it is included in the semiconductor module. Therefore, the terminal may be formed in a crank shape as seen in a side view or may be formed in an L-shape as seen in a side view. Alternatively, the terminal may be formed in an angled U-shape as seen in a side view.

While the embodiments and the modifications of this disclosure have been described hereinbefore, the embodiments and the modifications described above may be combined entirely or partially.

The invention is not limited to the embodiments and modifications described above, and various changes, substitutions, and alterations may be possible without departing from the spirit and scope of the invention. In addition, as long as the technical concept of the invention can be implemented using another method based on the technical progression and another derivative technology, the invention may also be embodied using that method. Therefore, the attached claims of the invention encompass all possible modes included in the scope of the technical concept.

Characteristics of the embodiments described above will be summarized as follows.

According to an aspect of the invention, there is provided a terminal structure of a semiconductor module, formed by bending a plate-shaped terminal, the terminal structure comprising plate surfaces, one of the plate surfaces having an unevenness including at least one of a plurality of hollow shapes or a plurality of protruding shapes formed in a predetermined region corresponding to an outer curved surface in a bent state. In this configuration, the surface area of the predetermined region of the one plate surface increases by the unevenness. Therefore, while a tensile stress is strongly applied to the predetermined region corresponding to the outer curved surface in a bent state of the terminal, elongation is allowed in the outer bending side as large as an increase of the surface area in the predetermined region. Since the increase of the surface area is used for elongation of the plate surface, it is possible to prevent a crack from being generated in the one plate surface and suitably bend the terminal while suppressing progression of corrosion and an increase of the electric resistance in the terminal.

In the terminal structure described above, the terminal is formed by covering a plate-shaped base material with a plating layer. In this configuration, it is possible to prevent base material cracking and plating cracking in the terminal.

In the terminal structure described above, the unevenness is formed through press fabrication for a base material before plating. In this configuration, it is possible to prevent plating cracking caused by press fabrication as in a case where the base material is plated before press fabrication.

In the terminal structure described above, the other plate surface of the terminal has a hollow formed in a predetermined region corresponding to an inner curved surface in a bent state, and the unevenness and the hollow have a positional relation where the unevenness and the hollow oppose on the front and back of the terminal. In this configuration, it is possible to improve bending accuracy by using the hollow on the other plate surface as a start point and deform the unevenness to match the bending starting from the hollow.

In the terminal structure described above, the one plate surface of the terminal has the unevenness formed in a predetermined region such that a height difference decreases as a distance from a center point of bending surface increases. In this configuration, it is possible to decrease a pitch of the unevenness in a portion where cracking is easily generated, such as the vicinity of the center point of bending surface and to increase the pitch of the unevenness in a portion far from the center point of bending surface, where cracking is not easily generated. Therefore, it is possible to form the unevenness having the surface area depending on vulnerability to cracking in the terminal.

In the terminal structure described above, the one plate surface of the terminal has the unevenness formed in the predetermined region such that the pitch increases as a distance from the center point of bending surface increases. In this configuration, it is possible to decrease the pitch of the unevenness in a portion where cracking is easily generated, such as the vicinity of the center point of bending surface and to increase the pitch of the unevenness in a portion far from the center point of bending surface, where cracking is not easily generated. Therefore, it is possible to form the unevenness having the surface area depending on vulnerability to cracking in the terminal.

In the terminal structure described above, the surface area of the unevenness is larger than the surface area of a case where the unevenness is not formed, by at least an increase of the area used for elongation in a bent state of the terminal. In this configuration, it is possible to sufficiently secure the surface area of the unevenness and prevent a crack from being generated in the terminal.

In the terminal structure described above, the surface area of the unevenness is 1.5 times or larger and 2.0 times or smaller than the surface area for the case where the unevenness is not formed. In this configuration, in the terminal used in a general semiconductor module, it is possible to suitably secure the surface area of the unevenness of the terminal and prevent a crack from being generated in the terminal.

In the terminal structure described above, one end side of the terminal is a bonding surface electrically connected to a semiconductor device, and the other end side of the terminal is bent oppositely to the bonding surface. In this configuration, a tensile stress applied to the outer bending side is alleviated when the other end side of the terminal is bent. Therefore, one end side of the terminal corresponding to the bonding surface is not easily lifted from the installation surface of the terminal by virtue of the tensile stress. Therefore, it is possible to suitably bond the semiconductor device and the bonding surface without increasing a gap between the one end side of the terminal and the installation surface.

In the terminal structure described above, the unevenness is formed in a hollow shape extending in a terminal width direction. In this configuration, it is possible to easily bend the terminal by reducing a bending strength of the terminal.

In the terminal structure described above, the unevenness includes a V-groove extending in the terminal width direction. In this configuration, it is possible to smoothly stretch the outer bending side by forming the unevenness with a V-groove to match an actual cracking shape of the terminal.

In the terminal structure described above, the V-groove has a rounded groove bottom. In this configuration, it is possible to suppress stress concentration in the groove bottom of the V-groove in a bent state of the terminal and to prevent a crack from being easily generated starting from the groove bottom of the V-groove in the terminal.

In the terminal structure described above, the unevenness includes a U-groove extending in the terminal width direction. In this configuration, a stress is not easily concentrated in the groove bottom of the U-groove, so that it is possible to prevent a crack from being easily generated.

According to another aspect of the invention, there is provided a semiconductor module including the terminal structure described above, wherein the terminal structure is applied to a plate-shaped terminal electrically connected to an electrode of a semiconductor device. In this configuration, it is possible to provide a semiconductor module capable of suppressing cracking of the terminal and improving an anti-corrosion property and an electric property.

According to further another aspect of the invention, there is provided a method of manufacturing a terminal installed in a semiconductor module, the method including: forming an unevenness including at least one of a plurality of hollow shapes or a plurality of protruding shapes in a predetermined region corresponding to an outer side in a bent state on one of plate surfaces of a base material of the terminal through press fabrication; and forming a plating layer by plating an outer surface of the base material.

REFERENCE SIGNS LIST

1: semiconductor module
11: ceramic circuit board (circuit board)
13: semiconductor device
20: terminal casing
31: terminal
32: bonding surface
35: base material
36: plating layer
41: one plate surface
42: predetermined region of one plate surface
43: unevenness
44: V-groove (hollow shape)
45: the other plate surface
46: predetermined region of the other plate surface
47: V-groove (hollow)
P: center point of bending surface

What is claimed is:

1. A terminal structure of a terminal connected to a semiconductor device included in a semiconductor module, comprising,
   plate-shaped portions at opposite ends of the terminal; and
   a single bent portion provided between the plate-shaped portions, the bent portion having an outer surface at an outer side thereof, and an inner surface at an inner side thereof, the outer surface including a first uneven surface having a plurality of hollow portions and a plurality of protruding portions.

2. The terminal structure according to claim 1, wherein the terminal includes a base terminal comprised of a base material, and a plating layer covering a surface of the base terminal including surfaces of the hollow portions and/or the protruding portions.

3. The terminal structure according to claim 1, wherein the inner surface of the bent portion of the terminal includes a second uneven surface having a plurality of hollow portions.

4. The terminal structure according to claim 1, wherein a distance, between a top and a bottom of each of the plurality of hollow portions or each of the plurality of protruding portions of the outer surface of the bent portion in a thickness direction of the terminal, decreases as a distance from a center of the bent portion increases.

5. The terminal structure according to claim 1, wherein a first size of the outer surface of the bent portion of the terminal is greater by a predetermined amount than a second size, the second size being a size of an outer surface of a bent portion of a comparison terminal that has a bent portion of the same size as the bent portion of the terminal, the outer surface of the bent portion of the comparison terminal being free of hollow portions and protruding portions, the predetermined amount corresponding to an amount of a difference between the second size and a third size, the third size being a size of the outer surface of the bent portion of the comparison terminal before being bent.

6. The terminal structure according to claim 5, wherein the first size of the outer surface of the bent portion of the terminal is in the range of 1.5 to 2.0 times the second size.

7. The terminal structure according to claim 1, wherein one of the plate-shaped portions at one end of the terminal has a bonding surface electrically connected to the semiconductor device, the bonding surface being on the same side of the outer surface of the bent portion.

8. The terminal structure according to claim 1, wherein the first uneven surface has the plurality of hollow portions, each of which extends in a width direction of the terminal.

9. The terminal according to claim 1, wherein the outer surface is a continuous surface.

10. The terminal according to claim 9, wherein the outer surface is a continuous surface that is comprised of a same material.

11. A semiconductor module, comprising
the terminal structure according to claim 1; and
a semiconductor device including an electrode that is electrically connected to one of the plate-shaped portions at one of the ends of the terminal.

12. A terminal structure of a terminal connected to a semiconductor device included in a semiconductor module, comprising,
plate-shaped portions at opposite ends of the terminal; and
a bent portion provided between the plate-shaped portions, the bent portion having an outer surface at an outer side thereof, and an inner surface at an inner side thereof, the outer surface including a first uneven surface having a plurality of hollow portions and/or a plurality of protruding portions, wherein
a pitch, between each two adjacent ones of the plurality of hollow portions of the outer surface of the bent portion, or a pitch, between each two adjacent ones the plurality of protruding portions of the outer surface of the bent portion, increases as a distance from a center point of the bent portion increases.

13. A method of manufacturing a semiconductor module including a semiconductor device and a terminal having plate-shaped portions at opposite ends thereof and a single bent portion between the plate-shaped portions, the method comprising:
forming a plurality of hollow portions and a plurality of protruding portions on one surface of a base terminal member that is to be the terminal, thereby forming a first uneven surface in a first area corresponding to an area of the bent portion of the terminal;
coating a surface of the base terminal member including the first uneven surface in the first area with a plating, thereby forming a plate-shaped terminal member;
electrically connecting the plate-shaped terminal member to the semiconductor device; and
bending the plate-shaped terminal member at an area corresponding to the first area, thereby forming the terminal with the bent portion and the plate-shaped portions, one of the plate-shaped portions being connected to the semiconductor device.

14. A method of manufacturing a semiconductor module according to claim 13, further comprising
forming a plurality of hollow portions on an other surface opposite to the one surface of the base terminal member, thereby forming a second uneven surface in a second area corresponding to an area of the bent portion of the terminal.

15. A method of manufacturing a semiconductor module according to claim 13, wherein
forming a first uneven surface in a first area includes forming the plurality of hollow portions on the one surface of the base terminal member in the first area, each of the hollow portions extending in a width direction parallel to a direction of the bending of the plate-shaped terminal member, and
bending the plate-shaped terminal member at the first area includes bending the plate-shaped terminal member in a direction parallel to the width directions of the hollow portions.

16. A method of manufacturing a semiconductor module according to claim 14, wherein
forming a second uneven surface in the first area includes forming the plurality of hollow portions on the other surface of the base terminal member in the first area, each of the hollow portions extending in a width direction parallel to a direction of the bending of the plate-shaped terminal member, and
bending the plate-shaped terminal such that the second uneven surface in the first area of the other surface is an inner side of the bent portion, the bending being performed along the width direction of one of the hollow portions in the second uneven surface in the first area.

17. A method of manufacturing a semiconductor module according to claim 13, wherein
forming a first uneven surface in a first area includes forming the plurality of hollow portions on the one surface of the base terminal member in the first area, a bottom of each of the hollow portions having a rounded shape.

18. A method of manufacturing a semiconductor module according to claim 13, wherein electrically connecting the plate-shaped terminal member to the semiconductor device includes inserting the plate-shaped terminal member into a fully molded structure in which the semiconductor device is fully molded.

19. A method of manufacturing a semiconductor module according to claim 13, wherein electrically connecting the plate-shaped terminal member to the semiconductor device includes inserting the plate-shaped terminal member into a terminal case to connect the semiconductor device to the plate-shaped terminal member through the terminal case.

\* \* \* \* \*